United States Patent

Kaire et al.

[11] 4,322,634
[45] Mar. 30, 1982

[54] DEVICE FOR PROTECTION IN THE CASE OF D.C. SUPPLY-VOLTAGE DROP

[75] Inventors: Jean-Claude Kaire, Caen; Jean-Claude G. Six, Versailles, both of France

[73] Assignee: U.S. Philips Corporation, New York, N.Y.

[21] Appl. No.: 103,668

[22] Filed: Dec. 14, 1979

[30] Foreign Application Priority Data

Dec. 29, 1978 [FR] France ............................. 78 36827

[51] Int. Cl.³ .......................................... H02H 3/247
[52] U.S. Cl. .......................... 307/200 A; 307/296 R; 307/442; 307/315; 340/663; 361/92; 361/98
[58] Field of Search ................... 307/200 A, 315, 296, 307/442; 340/663; 361/92, 98

[56] References Cited

U.S. PATENT DOCUMENTS

| | | | |
|---|---|---|---|
| 3,038,106 | 6/1962 | Cutsogeorge et al. | 307/200 A |
| 3,486,041 | 12/1969 | Thompson | 307/200 A |
| 4,099,068 | 7/1978 | Kobayashi et al. | 307/200 A |

Primary Examiner—John S. Heyman
Attorney, Agent, or Firm—James J. Cannon, Jr.

[57] ABSTRACT

A device for protection against power failures, having a programmable current source with two levels, which are controlled by a threshold detector, the current from the source being large at high voltages and reduced at low voltages.

5 Claims, 7 Drawing Figures

DEVICE FOR PROTECTION IN THE CASE OF D.C. SUPPLY-VOLTAGE DROP

BACKGROUND OF THE INVENTION

The present invention relates to a device for protection in the case of a drop of the voltage of a d.c. power supply which includes a capacitor in parallel with its terminals, said device having first and second supply voltage inputs and two outputs between which a circuit to be powered may be included.

As is known, domestic electrical appliances more and more utilize control devices with memory functions, in conjunction with timers, which put the appliance into operation after a predetermined time interval.

In the event of a current failure during said interval the information is generally seriously disturbed. It has already been attempted to mitigate the effects of brief current failures by connecting a capacitor in parallel with the input, which capacitor may at the same time constitute a smoothing capacitor. This capacitor discharges into the circuit and furnishes the required voltage and current for some time.

Circuit arrangements comprising such capacitors are given in all manuals and for example in the "Cours de base de l'agent technique electronicien" by C. Granfils, published by Les Editions Chiron.

Obviously the users of such an appliance wish that in the event of a failure said appliance keeps operating correctly for the longest possible time.

The present invention provides a solution to these problems; it is based on the recognition that an integrated circuit can correctly preserve the information it has received, even if it loses its dynamic properties, in the event of a reduced current.

SUMMARY OF THE INVENTION

The present invention relates to a device for protection in the case of a drop of the voltage of a d.c. power supply, including a capacitor in parallel with its terminals, said device having a first and a second supply voltage input and two outputs between which a circuit to be powered may be included, which device is characterized in that said outputs are energized via a programmable current source with two levels and in that, in parallel with said inputs, there is included a threshold-voltage detector which, depending on the relative values of the input voltage and the threshold voltage detected by said detector, selects a first level of the current from said programmable current source at high voltages and a second level at low voltages, said second current level being lower than said first level.

As the reduced current necessary to preserve the information is of the order of 100 times as small as the normal operating current, the duration of the failure which can be handled by the system is multiplied by a high factor of the order of 15 to 300.

The device in accordance with the invention can be realized in the form of a monolithic integrated circuit.

Since integrated threshold detectors can be realized in a very reliable manner, the simple device which is proposed is also reliable, effective and easy-to-integrate.

In a preferred embodiment of the device in accordance with the invention said programmable current source comprises a bridge of series resistors, of which at least one resistor is connected in parallel with a switch whose change-over is controlled by said threshold detector, said switch being closed at high voltages and open at low voltages.

This solution is particularly interesting because the two resistors together provide the high resistance for adjusting the reduced current. As is known, high resistances are often difficult to realize in integrated circuits. As the ratio of the resistance values in the stand-by-condition and the normal operating condition is of the order of 20, the short-circuited resistor will have a high value, but for a correct operation of the appliance it is not necessary that this value is accurately defined.

In a variant of said preferred embodiment of the device in accordance with the invention said programmable current source specifically comprises, in series with said circuit to be powered, a combination of at least two parallel-connected resistors, of which one resistor is connected in series with the switch whose change-over is controlled by said threshold detector, said switch being closed at high voltages and open at low voltages.

This solution may be particularly advantageous for reasons of topology.

Suitably, said switches are amplifiers comprising at least one bipolar transistor operated in the on-off mode.

Preferably use is made of an amplifier of the normal or mixed Darlington type, whose input transistor operates at a very small current, for example of a few nanoamperes; thus, the current source supplying the base of the input transistor only contributes to very small extent to the discharge of the capacitor.

Suitably, the threshold detector is a hysteresis detector, so that hunting effects can be avoided.

It is evident that the presence of this device does not exclude the presence of devices which, if the voltage decreases to such a value that the information is destroyed, reset the device to be energized to zero, thus providing an indication to the user that a failure has occurred.

The present invention is in particular applicable to power supplies for integrated logic circuits and more in particular to I²L circuits. The device can frequently be integrated on the same monolithic semiconductor chip as the circuit to be energized which it protects.

Furthermore, it will also be evident that this device, which has been developed to overcome the effects of current failures, may alternatively be used in the case of exhausted accumulators or batteries.

The following description with reference to the accompanying drawings, given by way of non-limitative example, will enable the invention to be more fully understood.

DESCRIPTION OF THE PREFERRED EMBODIMENTS

Figures 1, 5:
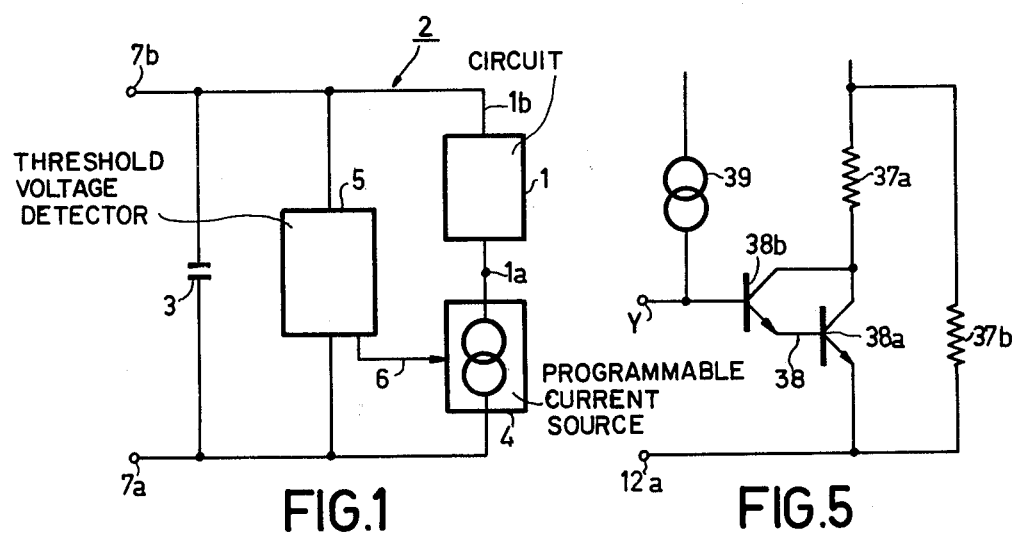
FIG. 1 is a circuit diagram of the invention.
FIG. 5 is a diagram of that part of the device in accordance with the invention which is a modification to the preferred embodiment of the invention.
Figure 2A:
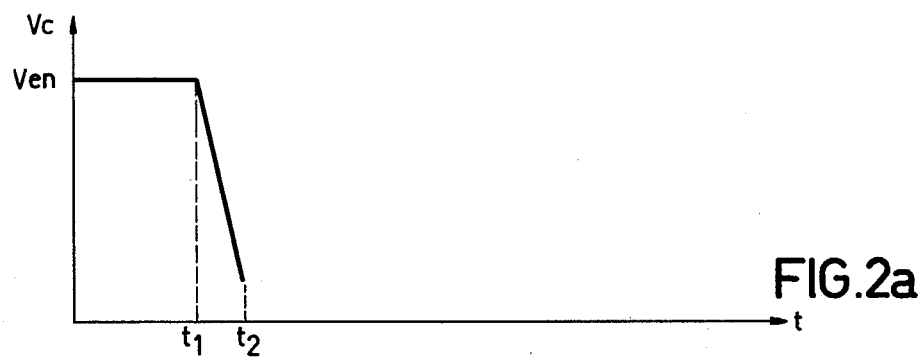
FIG. 2 represents the decrease, as a function of time, of the voltage $V_c$ across the capacitor in the absence (curve 2a) and the presence (curve 2b) of the device in accordance with the invention if the current source powering the device to be energized has ideal characteristics.
Figure 2B:
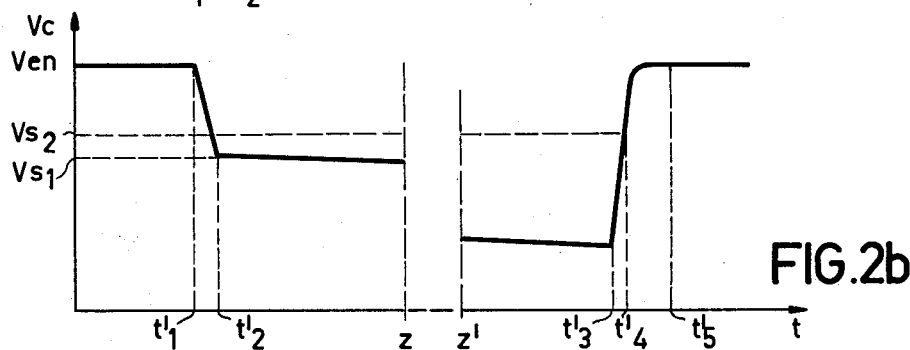

In FIG. 1 the reference numeral 1 represents the circuit to be powered and to be protected included between the output terminal 1a and 1b of the device 2 in accordance with the invention. 7a and 7b represent the first and the second input for the supply voltage $V_e$, which inputs also constitute the output terminals of the actual power supply, not shown. 3 represents the output capacitor of said power supply in parallel with said input 7a and 7b. 4 represents the programmable current source powering the circuit to be protected and 5 the threshold voltage detector which at 6 cooperates with said current source 4.

Said detector may control the change-over of the programmable current source from a first high (normal) current level to a second lower (reduced) current level and vice versa.

These change-overs are obtained by changing the circuit arrangement of the programmable current source 4, by switching resistors which form part of the current source, into or out of circuit with the aid of a set of switches, said resistors being referred to hereinafter by the term "internal resistance" of the current source.

It is to be noted that at a "large current" the voltage which is necessary across an I²L circuit in order to preserve the information, i.e. the voltage $V_d$ across a diode in the forward direction or the internal voltage of $V_{BE}$ of an emitter-base junction is 0.7 V, while it is only 0.5 V at a "small current" (1 µA).

When the input voltage $V_e$ at 7a, 7b has its normal value $V_{en}$ (for example 5 V), capacitor 3 is charged until it carries the charge $Q_n = CV_{en}$. The resistance which is equivalent to the internal resistance of the source is low, the current i fed into the circuit 1 by the source 4 being the normal operating current $I_n$.

If at the instant $t_1$ the supply voltage is interrupted after capacitor 3 has been charged, said charge produces a voltage $V_c$ across the capacitor 3, which voltage is $V_{en}$ upon interruption. The capacitor discharges in accordance with the relationship $CV_c = i.t$ for an ideal current source or in accordance with the function with the exponent $-t/RC$ for a current source which is approximated by a voltage and a resistance, t being the discharge time, R the equivalent series resistance, C the capacitance of the capacitor, $V_c$ the voltage across the capacitor. The curve 2a represents the discharge in accordance with the first function and the curve 3a the discharge in accordance with the second function, in the absence of the device in accordance with the invention.

If the current source supplies its high level (during normal operation), the charge of the capacitor decreases rapidly.

For an ideal current source (function $CV_c = it$) it may roughly be assumed that at a voltage of 5 V applied to the terminals of a 100−µF capacitor and at a high current level of the order of 0.5 mA the charge of the capacitor and the voltage across it are halved in 0.5 seconds. In the absence of the device in accordance with the invention this voltage $V_c$ will be smaller than 0.7 V in 0.86 seconds (time $t_2$ of the curve 2a), which is the minimum voltage for maintaining the information (at high current level) in an I²L circuit. From this instant on the information will be destroyed.

If the ideal current source is replaced by a 10 kΩ resistor (function with exponent t/RC), the time intervals after which the voltage $V_c$ across the capacitor has been halved and subsequently becomes smaller than 0.7 V are 1 and 3 seconds respectively. From this moment on the information will be destroyed.

However, if the device in accordance with the present invention is used and an interruption occurs at the instant t'1 (curves 2b and 3b), the capacitor at first discharges rapidly in exactly the same way as in the preceding case, but when at the instant t'2 the voltage $V_c$ across it reaches a threshold value $V_{s1}$ the detector detects this and ensures via 6 that the current source 4 is adapted; the current supplied by this source is then a reduced current and the capacitor discharges very slowly. On the curve 2b and on the curve 3b this discharge is represented between t'2 and t'3. (These portions of the curves have been interrupted at Z×Z' in order to maintain a certain homogeneity in scale).

The example is considered of an I²L circuit which, in order to maintain the information which it contains, requires a current which is slightly greater than 10 nA per port and which comprises for example approximately 300 ports. For an ideal current source having a reduced current of 3 µA and a $V_{sl}$ of 3.1 V, the charge of the capacitor, i.e. the voltage $V_c$ across it, is halved in 43 seconds; the voltage $V_c$ reaches the value of 1 V in 53 seconds. If the ideal source is replaced by a 167,000Ω resistor, the voltage across the capacitor is halved in 16.7 seconds and reaches a value of 0.7 V in 34 seconds.

Depending on the embodiment, a circuit protected by the device in accordance with the invention can cope with an interruption of 30 to 50 seconds instead of 0.86 second and 3 seconds.

It is to be noted that without any problems a capacitor may be used having a value which is 10 times as high, which multiplies the times by 10, and that if the power supply to be used does not comprise an output capacitor or comprises a capacitor of insufficient capacitance, it suffices to add a suitable capacitance.

When the current interruption terminates within said time interval, for example at t'3, the voltage increases rapidly to its normal value and the normal power supply of the circuit is restored.

In order to avoid hunting, it is preferred to use a threshold detector with hysteresis, whose second threshold $V_{s2}$ is higher than the first threshold $V_{s1}$. For example, for an input voltage of 5 V and a $V_s$ of 3.1 V, $V_{s2}$ may be fixed at 3.5 V. On the curves 2b and 3b the instant t't is indicated after which the circuit to be energized resumes it dynamic operation, the charge of capacitor 3 not being complete until the instant t'5.

Figure 4:
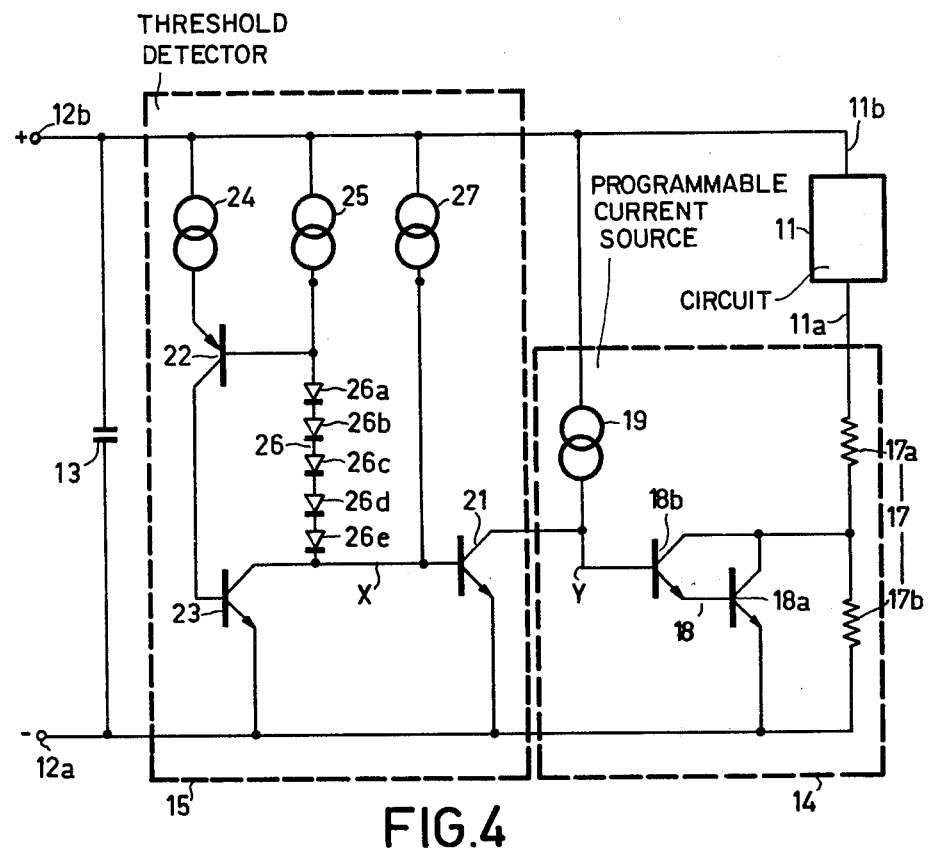
FIG. 4 is a diagram of a preferred embodiment of a device in accordance with the invention.

In FIG. 4 the reference numeral 11 represents the circuit to be energized which is inserted between the outputs 11a and 11b of the device, 12a represents the first input of the device connected to the negative pole of the power supply, and 12b the second input connected to the positive pole of the power supply (said power supply not being shown in the Figure, except for the output capacitor 13), the frame 15 representing the threshold detector and the frame 14 a set of transistors and resistors controlled by the threshold detector at Y; said combination 14 constitutes the programmable current source in its preferred embodiment.

The programmable current source 14 comprises a resistor bridge 17 comprising at least two resistors in series: 17a, of which one end is connected to the output 11a, and 17b, of which one end is connected to the negative input 12a. The characteristics of this current source are not ideal, but approximately ideal, which is not objectionable for its use in the present invention.

Across the resistor 17b an NPN switching transistor 18a is included in common-emitter arrangement, whose emitter is connected to the input 12 and whose collector is connected to the point which is common to the resistors 17a and 17b. In the present example this transistor is the output transistor of a Darlington circuit 18 of the normal type, whose NPN-type input transistor is designated 18b. The base of transistor 18a is thus connected to the emitter of the transistor 18b, whose collector is connected to the collector of the transistor 18a. This Darlington circuit with two transistors of the same type may be replaced by a Darlington circuit of the "mixed" type with two complementary transistors.

The base Y of the transistor 18b is connected directly to an NPN output transistor 21 of the threshold detector 15, which is to be described hereinafter, and to the current source 19 which supplies a very small current.

When the supply voltage $V_e$ has its normal value $V_{en}$ (for example 5 V), the voltage at Y supplied by the threshold detector has its high level (1.4 V=2 $V_{BE}$) relative to the negative terminal of the circuit and the Darlington circuit 18 is conductive (transistor 21 is cut off). As transistor 18a, which operates as switch, is bottomed, it constitutes a short-circuit across the resistor 17b (but a voltage of 0.7 V remains across said resistor). The circuit to be energized 11 is then supplied via the resistor 17a, which then substantially constitutes the internal resistance of the current source 14 in this mode, its value mainly determining the level of the current from the current source 14. This resistor is proportioned so as to obtain the normal operating current for the circuit 11 to be energized.

For example, if the voltage $V_{en}$ is 5 V and the desired normal current is 0.5 mA, while the voltages across transistor 18a and across the circuit to be energized, at the high current level, are 0.7 V each, the voltage across the resistor 17a will be 3.6 V and the value of said resistor 7.2 k ohms.

Figure 3A:
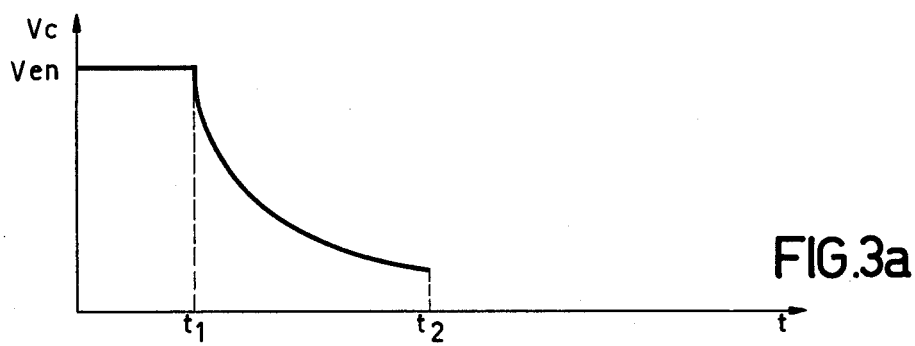
FIG. 3 represents the decrease, as a function of time, of the voltage $V_c$ across the capacitor in the absence (curve 3a) and the presence (curve 3b) of the device in accordance with the invention if said current source is an approximately ideal source constituted by resistors in series with a supply voltage.
Figure 3B:
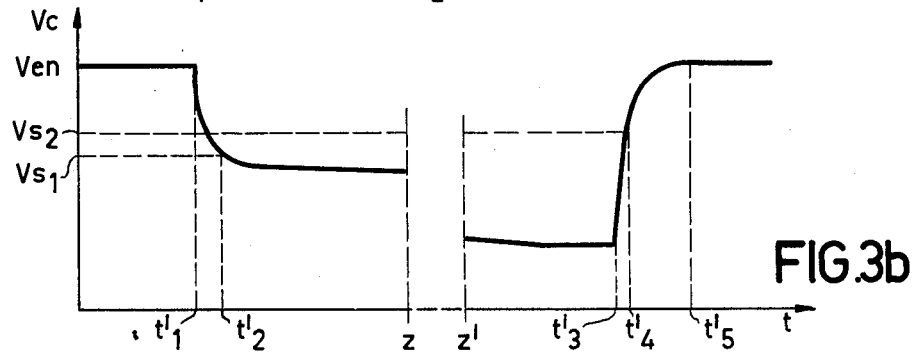

When the supply voltage is interrupted the capacitor 13 at first discharges rapidly in accordance with the curve portion t'1, t'2 in FIG. 3b and the circuit to be energized is no longer in its dynamic state and assumes a stand-by state. When the voltage across capacitor $V_c$ reaches the threshold value $V_{s1}$, transistor 21 is turned on and the voltage supplied to Y by detector 15 drops to $V_{ce}$ sat. of transistor 21, substantially below 1.4 V; the Darlington circuit 18 is then no longer conductive. The switch constituted by the transistor 18a is open. The current from the source 19 passes through the transistor 21 back to the line of the negative connection 12a; as said source only supplies a few nanoamperes, it contributes only slightly to the discharge of the capacitor. It is to be noted that the current sources 24, 25, 27 and 19 are sources of the $I^2L$ type, so that their current is related to the current of the circuit to be powered; as a result of this, all these currents decrease at the same time.

The current source 14 is then connected in series with an additional internal resistance 17b, which may be given a high value.

The value of the internal resistance of the current source 14 is consequently the sum of the values of the resistors 17a and 17b. For example, for a device whose limit voltage and minimum current for maintaining the information are 0.5 V and 3 μA respectively, a resistor 17a+17b of approximately 167,000Ω (i.e. a resistor 17a of approximately 160,000Ω) enables the system to remain in the stand-by mode as long as the voltage across the capacitor is higher than 1 V. If the threshold $V_{s1}$ is 3.1 V, the stand-by period which is attainable is approximately 25 seconds. It is thus of the order 10 to 15 times longer than it would have been in the absence of the additional internal resistance, because in that case it would have been less than 3 seconds. As has already been stated in the foregoing, it is readily possible to employ a capacitor having a capacitance which is 10 times as high, so that the stand-by period attainable is multiplied by 10. It is then of the order of 5 minutes and a mains failure rarely continues for longer than 5 minutes.

For the example whose diagram is shown in FIG. 4, a threshold detector has been chosen which is an improved version of the detector described in Patent Application no. 75 12 480, filed by the Applicant on Apr. 22, 1975.

This detector comprises at least two complementary transistors 22 and 23 and an output transistor 21, the base of transistor 21 being connected directly to the collector of the transistor 23, which is of the same type as said transistor 21, and a point hereinafter referred to as X. In this specific example shown the transistor 21 is of the NPN-type, the transistor 22 is of the PNP-type, its emitter being connected to the positive input 12b via a current source 24 and its collector being connected to the base of transistor 23. The transistor 23 is of the NPN-type, its emitter being connected to the negative input 12a.

The base of the transistor 22 is connected to the positive input 12b via a current source 25 and to the point X via several series-connected diodes 26 (five in the present example, 26a, 26b, 26c, 26d, 26e), included in the forward direction.

The detector output-transistor 21, which is of the NPN type, is connected in common emitter arrangement and its emitter is connected directly to the negative input 12a. The base of this transistor (point X) is fed by the current generator 27. Its collector directly controls the current source 14, as has been described in the foregoing. The five diodes 26 mentioned in the foregoing may be replaced by one zener diode with a breakdown voltage of 2.5 V.

This detector is a hysteresis detector which complies with the requirement of compatibility with current-injection integrated circuits and which operates as follows:

When the input voltage $V_e$ is zero, or rather very low, the two complementary input transistors 22 of the PNP-type and 23 of the NPN-type, (in present example), conduct no current because they receive no power supply. As the two transistors 22 and 23 are not in the conductive state, the current injected by the source 27, which current reaches the base of the transistor 21 at X at the base of transistor 21, cannot pass through this last-mentioned transistor. The value of the voltage $V_y$ between the collector and the emitter of the detector output-transistor 21, which defines the level at the output point Y of the detector and which influences the programmable current source, is minimal: $V_{yb}$ (for example 0.3 V). The Darlington circuit 18 is not conductive. The current from the source 19 flows through the transistor 21.

If the input voltage $V_3$ increases, transistor 22 is turned on when the voltage between its base and its emitter becomes higher than the internal base-emitter voltage $V_{BE22}$, i.e. for silicon transistors when it reaches the value 0.5 V.

As the two transistors 22 and 21 are connected oppositely and are of opposite types, the two internal voltages $V_{BE22}$ and $V_{BE21}$ augment each other and the presence of the n diodes 26 connected in the forward direction causes a shift of the voltages applied to the transistor 22 relative to the voltages applied to the transistor 21 by a voltage equal to n times the voltage $V_d$ across said diodes in the forward direction.

When the input voltage $V_e$ thus reaches the value $V_{BE22} + V_{BE21} + n.V_d$, the transistor 22 is turned on and drives transistor 23 which is also turned on.

For silicon transistors and diodes, as a result of the fact that the circuit operates at a very small current, the base emitter voltages and the forward voltages $V_d$ are equal to 0.5 V. If n=5, the threshold voltage, V threshold ($V_{s2}$), is 7×0.5 V =3.5 V. The voltage at X on the base of transistor 21 drops to the value of the internal collector-emitter voltage $V_{CE23}$ of the transistor 23 (for example 0.1 V for a silicon transistor at a small current) and the output transistor 21 of the detector is turned off, the output voltage at point Y increasing to a high level $V_{yh}$ (for example 1.4 V).

The value of the input voltage $V_e$, which is equal to $V_{BE22} + V_{BE21} + nV_d$, thus constitutes a rising threshold $V_{s2}$ which determines the change-over of the voltage $V_y$ (at the output of the detector) from a low level $V_{yb}$ to a high level $V_{yh}$.

When the input voltage $V_e$ has its high level, transistor 22 and transistor 23 are conductive, the voltage at X has its low level (for example 0.1 V), transistor 21 is cut-off, the voltage at Y thus has its high level (for example higher than 1.4 V for silicon transistors), the Darlington circuit 18 is conductive, and the resistance 17b is short-circuited. The internal resistance of the current source 14 constituting said source is then limited to the resistance value 17a. The circuit 11 to be powered is energized normally (for example with 0.5 mA for a voltage $V_e$=5 V). It is to be noted that the current from the source 19 is taken up by the Darlington circuit 18 and not by the transistor 21.

If the voltage $V_e$ decreases, the state of the system does not change, even when it becomes lower than the risingthreshold $V_{s2}$, and as long as it remains higher than the value $V_{BE22} + nV_d + V_{Ce23}$, below which the combination of the two complementary transistors 22 and 23 cannot conduct. This value of the input voltage thus constitutes a falling threshold $V_{s1}$, which determines the change-over of the voltage at Y from the high level $V_{yh}$ to the low level $V_{yb}$, the system resuming its previous state; the resistance 17b is no longer short-circuited and the system changes over to the stand-by state with reduced current.

In the example chosen, for which $V_{BE22} = V_d = 0.5$ V and $V_{CE23} = 0.1$ V, $V_{s1} = 3.1$ V.

It is to be noted that the entire system operates with a very small current, for example 1 μA for the source 24 and 0.1 μA for the base current of the transistor 22. Such a small base current may vary from one batch to another. The source 25, as it supplies a higher base current (of the order of 1 μA) which is better reproducible, makes it possible to obtain diode voltages which are slightly higher and to adjust the threshold more accurately to the desired value, for example 3.1 V.

It is to be noted that the device as described in the foregoing, as well as the variant described further on, can be realized with transistors of inverse types. Such an inversion will not present any problems to those skilled in the art.

FIG. 5 shows a variant of the programmable current source, which in the device of FIG. 4 may replace the current source within the frame 14.

Said source comprises two resistors in parallel, on the one hand 37b of a high value (of the order of 150,000 or 200,000Ω), for example, and on the other hand 37a of low value (5 to 15,000Ω for example) in series with the main current path of a transistor 38a, which in the present example is of the NPN type. This transistor, whose emitter is connected to the negative input 12a is the output transistor of a Darlington circuit of the normal type, whose input transistor is the transistor 38b of the NPN type. The base of this transistor is the point Y, which is connected to the current source 39, which is similar to the source 19, and to the collector of the transistor $T_{21}$, which is not shown in FIG. 5.

The operation is as follows:

At high voltages (higher than $V_{s1}$) point Y is at a voltage higher than 1.4 V, the Darlington circuit 38 conducts and functions as a closed switch, the normal current (0.5 mA) being distributed between the two resistors 37a and 37b. At low voltages, point Y is at a voltage much lower than 1.4 V, the Darlington circuit 38 is turned off and functions as an open switch, the stand-by current flowing only in the resistor 37b of high value. The resistor values may for example be 170 kΩ for 37b and 10 kΩ for 37a.

The device in accordance with the present invention may be realized by means of discrete elements. It may also be realized in the form of a monolithic integrated circuit: the various elements may for example be integrated in a silicon monocrystal, whose substrate of a first conductivity type (for example P) carries an epitaxial layer of the opposite type (for example N) arranged in islands which are insulated from each other. The device can be realized using solely known techniques: epitaxial growth, diffusion, metallization, a description of which is beyond the scope of this application.

What is claimed is:

1. A device for protection for a circuit in the case of a drop of the voltage of a d.c. power supply having a capacitor in parallel with its terminals, said device including first and second supply voltage inputs and two outputs between which a circuit to be powered may be included, said device comprising:

a programmable current source with two levels to energize said outputs;

a threshold-voltage detector in parallel with said inputs which, depending on the relative values of the input voltage and the threshold voltage detected by said detector selects a first level of the current from said programmable current source at high voltages and a second level at low voltages, said second current level being lower than said first level;

said programmable current source comprising:

a bridge of series resistors, a switch;

at least one of said resistors being connected in parallel with said switch whose change-over is controlled by said threshold detector, said switch being closed at high voltages and open at low voltages;

said detector specifically comprising:

a first and a second complementary transistor, the base of said first transistor being connected to the collector of said second transistor, the emitter of the first transistor being connected to a first input, and the emitter of the second transistor being connected to a second input via a current source, the collector of said first transistor influencing the base of a third transistor of the same type as the first transistor, whose emitter also constitutes the first input and whose collector constitutes the output of the detector;

a diode;

a current source;

said collector of said first transistor being connected to a current source and, through at least one diode in the forward direction, to the base of said second transistor, which in its turn is connected to said current source.

2. A device for protection of a circuit in the case of a drop of the voltage of a d.c. power supply having a capacitor in parallel with its terminals, said device including first and second supply voltage inputs and two outputs between which a circuit to be powered may be included, said device comprising:

a programmable current source with two levels to energetic said outputs;

a threshold-voltage detector in parallel with said inputs which, depending on the relative values of the input voltage and the threshold voltage detected by said detector selects a first level of the current from said programmable current source at high voltages and a second level at low voltages, said second current being lower than said first level;

said programmable current source comprising:

a bridge of series resistors;

a switch;

at least one of said resistors is connected in parallel with a switch whose change-over is controlled by said threshold detector, said switch being closed at high voltages and open at low voltages;

said current source specificaly comprising:

a switch;

a combination of at least two parallel-connected resistors, in series with said circuit to be powered, of which one resistor is connected in series with the switch whose change-over is controlled by said threshold detector, said switch being closed at high voltages ad open at low voltages;

said detector specifically comprising:

a first and a second complementary transistor, the base of said first transistor being connected to the collector of said second transistor, the emitter of the first transistor being connected to a first input, and the emitter of the second transistor being connected to a second input via a current source, the collector of said first transistor influencing the base of a third transistor of the same type as the first transistor, whose emitter also constitutes the first input and whose collector constitutes the output of the detector;

a diode;

a current source;

said collector of said first transistor being connected to a current source and, via at least one diode in the forward direction, to the base of said second transistor, which in its turn is connected to a current source.

3. A device as claimed in claim 1 or 2 characterized in that said switch is an amplifier comprising at least one bipolar transistor which is operated in the on-off mode.

4. A device as claimed in claim 3, characterized in that said amplifier is an arrangement of the Darlington type.

5. A device as claimed in any of the claims 1 or 2 characterized in that said threshold detector is a hysteresis detector.

* * * * *